United States Patent
Shiokawa

(10) Patent No.: US 6,593,253 B1
(45) Date of Patent: Jul. 15, 2003

(54) METHOD OF MANUFACTURING SEMICONDUCTOR DEVICE

(75) Inventor: Nagamasa Shiokawa, Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/763,127
(22) PCT Filed: Jun. 21, 1999
(86) PCT No.: PCT/JP99/03290
§ 371 (c)(1), (2), (4) Date: Feb. 20, 2001
(87) PCT Pub. No.: WO00/79580
PCT Pub. Date: Dec. 28, 2000
(51) Int. Cl.$^7$ .......................... H01L 21/31; H01L 21/469
(52) U.S. Cl. .................. 438/787; 438/758; 438/770; 438/778
(58) Field of Search .................. 438/758, 769, 438/770, 778, 787, 788, FOR 407, FOR 408; 118/719

(56) References Cited

U.S. PATENT DOCUMENTS

| | | | | |
|---|---|---|---|---|
| 5,217,501 A | * | 6/1993 | Fuse et al. | 29/25.01 |
| 5,271,732 A | * | 12/1993 | Yokokawa | 432/241 |
| 5,352,636 A | * | 10/1994 | Beinglass | 438/475 |
| 6,276,072 B1 | * | 8/2001 | Morad et al. | 34/428 |
| 6,391,116 B2 | * | 5/2002 | Moriyama | 118/724 |

FOREIGN PATENT DOCUMENTS

| | | |
|---|---|---|
| JP | 54-4069 | 1/1979 |
| JP | 4-78137 | 3/1992 |
| JP | 4-329630 | 11/1992 |
| JP | 5-102132 | 4/1993 |
| JP | 11-186257 | 7/1999 |

OTHER PUBLICATIONS

Oonuma (JP 05102132) (Translation).*

* cited by examiner

Primary Examiner—Amir Zarabian
Assistant Examiner—Maria Guerrero
(74) Attorney, Agent, or Firm—Finnegan, Henderson, Farabow, Garrett & Dunner, L.L.P.

(57) ABSTRACT

A high quality thermal oxide film is provided. For the purpose of the film, a cooling step is conducted after replacing an atmosphere in the diffusion furnace (1) with a high purity gas mixture of nitrogen $N_2$ 99% and oxygen $O_2$ 1% after an oxidizing and an annealing steps. Then, a pump (DP) is turned on to evacuate a load-lock chamber (6), which is then filled with nitrogen $N_2$. Then, while feeding a gas mixture of nitrogen $N_2$ 99% and oxygen $O_2$ 1% into the diffusion furnace (1), a wafer boat (3) is transferred from the diffusion furnace (1) to the load-lock chamber (6) (Removing step). Thus, the cooling and the removing steps are conducted under an atmosphere gas of a high purity mixture of nitrogen and a small amount of high purity oxygen free from impurities in the air. Only high purity oxygen is, therefore, introduced in an interface between a silicon substrate and an oxide film, so that a high quality thermal oxide film can be provided.

6 Claims, 3 Drawing Sheets

METHOD OF MANUFACTURING SEMICONDUCTOR DEVICE

FIELD OF THE INVENTION

This invention relates to a process for manufacturing a semiconductor device comprising forming a thermal oxide film. In particular, it relates to a process for manufacturing a semiconductor device, whereby a high quality thermal oxide film can be formed.

BACKGROUND ART

A thermal oxide film has been formed with a vertical diffusion furnace 10, for example, as illustrated in FIG. 3. This vertical diffusion furnace comprises a cylindrical diffusion furnace 1 made of a quartz tube whose lower end is opened. For thermal oxidation, first, a wafer boat 3 on which a plurality of semiconductor wafers are placed is inserted from the opening and then the opening is closed. The diffusion furnace 1 is externally heated with a heater 4 surrounding the diffusion furnace 1. While maintaining the status, gases such as nitrogen $N_2$, oxygen $O_2$ and steam $H_2O$ are fed into the diffusion furnace 1 through a gas inlet 5 on the top of the diffusion furnace 1, to thermally oxidize the semiconductor wafers on the wafer boat 3.

Atmosphere gases such as nitrogen $N_2$, oxygen $O_2$ and moisture $H_2O$ are, as appropriate, fed in the diffusion furnace 1 in each of a sequence of steps including inserting the wafer boat 3 into the diffusion furnace 1; stabilizing an internal temperature of the furnace; oxidizing for forming an oxide film; annealing; and removing the wafer boat 3 from the furnace. In particular, after annealing, the wafer boat 3 is removed under an atmosphere of high purity nitrogen for avoiding further oxidation.

Such a process for forming a thermal oxide film employing the vertical diffusion furnace 10 has been, however, inadequate in terms of, for example, a stress lifetime in the resulting thermal oxide film.

Thus, we have conducted a sequence of thermal oxidation using a diffusion furnace equipped with a load-lock chamber as described in Japanese Patent Laid-Open No. 4-329630, so-called "a load-lock diffusion furnace", in the light of the fact that in a process employing the conventional diffusion furnace, oxygen and other impurity gases as well as particles in the air are incorporated in atmosphere gases due to uptake of the air during inserting a semiconductor wafer into the diffusion furnace 1 made of a quartz tube or removing the semiconductor wafer from the diffusion furnace 1.

The load-lock diffusion furnace 100 comprises a load-lock chamber 6 in a lower opening in the diffusion furnace 1 made of a quartz tube as illustrated in FIG. 1. This load-lock chamber 6 further comprises a pump DP for degassing as well as a gate $G_1$ for separating the diffusion furnace 1 from the load-lock chamber 6, a gate $G_2$ for separating the load-lock chamber 6 from the outer atmosphere and a gas inlet 7 for feeding nitrogen gas into the load-lock chamber 6.

Using the load-lock diffusion furnace 100, thermal oxidation was conducted as follows. First, in the diffusion furnace 1, oxidation is conducted under a high purity atmosphere gas of hydrogen and oxygen. Then after replacing the atmosphere gas in the diffusion furnace 1 with high purity nitrogen, the system is cooled. Then, the pump DP is turned on to evacuate the load-lock chamber 6, nitrogen gas is fed through the gas inlet 7, the gate $G_1$ is opened and the wafer boat 3 is transferred into the load-lock chamber 6.

As described above, a cooling and a removing steps were conducted under the atmosphere of high purity nitrogen free from impurity gases such as oxygen or particles in the air.

It was, however, found that in this process for forming a thermal oxide film, strain occurs in an $SiO_2/Si$ bond due to stress generated in an interface between a thermal oxide film and a silicon substrate, during the cooling and the removing steps, giving an insulating film susceptible to stress. Furthermore, determination of a lifetime for the thermal oxide film formed demonstrated that the lifetime was significantly reduced than that for a thermal oxide film formed by a process using a conventional vertical diffusion furnace 10 as illustrated in FIG. 3.

Thus, to solve the above continuing problems in the prior art, this invention aims at providing a process for manufacturing a semiconductor device, which can provide a high quality thermal oxide film.

SUMMARY

After investigating the above problems in the thermal oxide film, we have found that they are caused by a reduced purity of nitrogen ($N_2$) atmosphere gas during the cooling or the removing step and can be solved by blending a small amount of oxygen $O_2$ in the high purity $N_2$ atmosphere gas while eliminating impurities in the air during these steps, resulting in completion of this invention.

This invention, which can achieve the above objectives, provides a process for manufacturing a semiconductor device comprising heating a semiconductor wafer in a diffusion furnace equipped with a load-lock chamber, characterized in that an atmosphere gas for the semiconductor wafer during removing the wafer from the diffusion furnace is a mixture of nitrogen gas and oxygen gas in such a level that the thickness of an oxide film on the semiconductor wafer is substantially constant.

In the process, after heating, the diffusion furnace is cooled to a predetermined internal temperature prior to removing the semiconductor wafer from the diffusion furnace, and during the cooling step, the atmosphere gas in the diffusion furnace is also the gas mixture.

Furthermore, during the semiconductor wafer is in the diffusion furnace, the load-lock chamber is evacuated before nitrogen gas is fed, and then the semiconductor wafer is transferred to the load-lock chamber while feeding the gas mixture to the load-lock chamber.

The process further comprises transferring the semiconductor wafer from the load-lock chamber to the diffusion furnace, and the above gas mixture is also used as an atmosphere gas for the semiconductor wafer during the transferring step and a preliminary processing in the diffusion furnace before initiating the heating step. The preliminary step comprises warming the diffusion furnace to a predetermined internal temperature and stabilizing the internal temperature of the diffusion furnace after the warming.

The gas mixture contains 0.1 to 10% of oxygen gas.

Nitrogen and oxygen gases used preferably have a higher purity of about 99.999% or more.

DESCRIPTION OF PREFERRED EMBODIMENTS

Some embodiments of this invention will be described with reference to examples.

Figure 1:
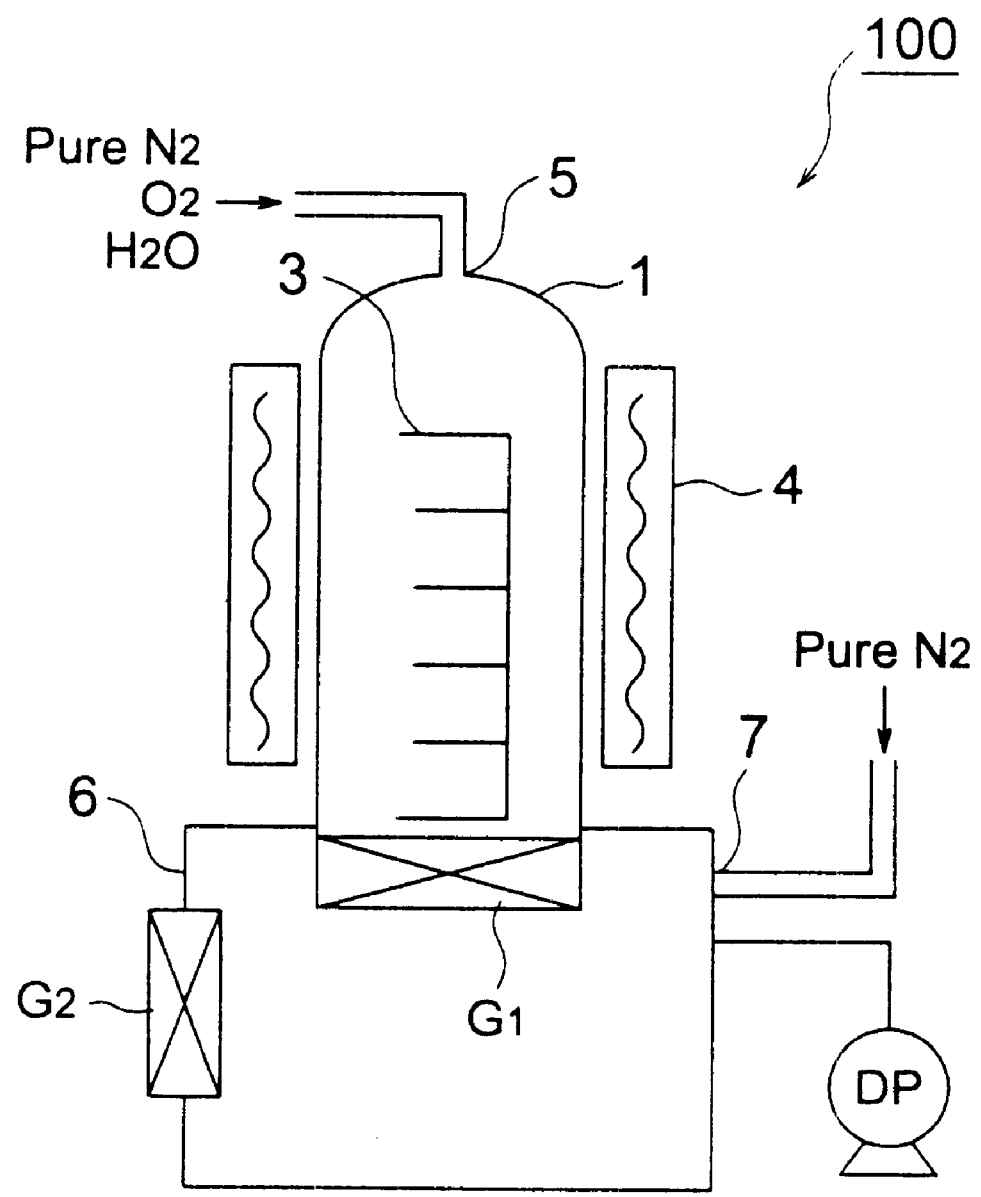
FIG. 1 schematically shows a configuration for an example of a load-lock diffusion furnace used in this invention.

FIG. 1 schematically shows a configuration of a load-lock diffusion furnace 100 used in this invention. The load-lock diffusion furnace 100 comprises a diffusion furnace 1 made of a quartz tube whose lower end is opened and a load-lock chamber 6 in the opening of the diffusion furnace 1.

For thermal oxidation to a semiconductor wafer, first, a wafer boat 3 on which a plurality of semiconductor wafers are placed is inserted into the diffusion furnace 1 and then the diffusion furnace 1 is externally heated with a heater 4 surrounding the diffusion furnace 1. While maintaining the status, gases such as nitrogen $N_2$, oxygen $O_2$ and steam $H_2O$ are fed into the diffusion furnace 1 through a gas inlet 5 connected to the top of the diffusion furnace 1. Thus, gases fed through the gas inlet 5 are sequentially evacuated from a vent (not shown), while the semiconductor wafers are subject to thermal oxidation.

The load-lock chamber 6 comprises a switching gate $G_1$ for separating the diffusion furnace 1 from the load-lock chamber 6 and a gate $G_2$ for inserting the wafers into the load-lock chamber 6. It further comprises a pump DP for degassing as well as a gas inlet 7 for feeding nitrogen $N_2$ gas.

Atmosphere gases such as nitrogen $N_2$, oxygen $O_2$ and moisture $H_2O$ are, as appropriate, fed in the diffusion furnace 1 in each of a sequence of steps including inserting the wafer boat 3 into the diffusion furnace 1; heating the furnace to a desired internal temperature; stabilizing the internal temperature of the furnace; oxidizing for forming an oxide film; annealing; cooling the furnace to a given internal temperature; and removing the wafer boat 3 from the furnace.

For inserting the wafer boat 3 into the diffusion furnace 1, first, the gate $G_1$ is closed, the wafer boat 3 is inserted into the load-lock chamber 6, the gate $G_2$ is closed and then the atmosphere in the load-lock chamber 6 is changed from the air to nitrogen gas. Thus, after separating the wafer boat 3 from the air, the gate $G_1$ is opened and the wafer boat 3 is then transferred into the diffusion furnace 1.

On the other hand, for removing the wafer boat 3 from the diffusion furnace 1, nitrogen gas is fed into the load-lock chamber 6, the wafer boat 3 is transferred from the diffusion furnace 1 to the load-lock chamber 6, and then the wafer boat 3 is removed from the load-lock chamber.

There will be described a process for forming a thermal oxide film using the above load-lock type of diffusion furnace 100. In the process, nitrogen $N_2$ and oxygen $O_2$ fed in the diffusion furnace 1 and the load-lock chamber 6 are high purity atmosphere gases with a purity of 99.999% or higher.

In the diffusion furnace 1 are fed nitrogen $N_2$ and a small amount of oxygen $O_2$ through the gas inlet 5, to fill the furnace with a high purity atmosphere of nitrogen $N_2$ 99% and oxygen $O_2$ 1% at 700° C. The gate $G_1$ is closed to maintain the diffusion furnace 1 in a stand-by state.

Then, while closing the gate $G_1$, the gate $G_2$ is opened and the wafer boat 3 in the air, on which the semiconductor wafers are placed, is transferred to the load-lock chamber 6.

Then, the gate $G_2$ is closed, the load-lock chamber 6 is sealed and the pump DP for degassing was turned on to evacuate the load-lock chamber 6. Then, high purity nitrogen $N_2$ is fed from the gas inlet 7 and the chamber is closed. Thus, the wafer boat 3 is separated from the air under the atmosphere of nitrogen gas.

Then, the gate $G_1$ is opened, and the wafer boat 3 is inserted for 20 min into the diffusion furnace 1 kept in a stand-by state under a high-purity gas mixture of nitrogen $N_2$ 99% and $O_2$ 1% at 700° C., and then the gate $G_1$ is closed (Inserting step).

Then, keeping the atmosphere gases in the stand-by state, the inside of the furnace was heated to 850° C. for 30 min (Heating step).

Then, the semiconductor wafers are retained in the high purity atmosphere gas of nitrogen $N_2$ 99% and oxygen $O_2$ 1% at 850° C. for 15 min for stabilizing the internal temperature of the furnace to improve temperature homogeneity in and among the semiconductor wafers (Stabilizing step).

The atmosphere in the diffusion furnace 1 was replaced with an atmosphere at 850° C. meeting the relationship of hydrogen $H_2:O_2=1:2$. Under the temperature condition of, e.g., 850° C., the wafers were subject to WET oxidation for 3 min to provide an oxide film with a desired film thickness (Oxidizing step).

Then, the atmosphere gas in the diffusion furnace 1 is replaced with nitrogen $N_2$. Under the high purity 100% nitrogen atmosphere, the wafers are annealed at 850° C. for 30 min (Annealing step).

The atmosphere gas in the diffusion furnace 1 is replaced with a high purity atmosphere gas of nitrogen $N_2$ 99% and oxygen $O_2$ 1%, and then the inside of the furnace is cooled to 700° C. for 40 min (Cooling step).

After evacuating the load-lock chamber 6 by turning on the pump DP, high purity nitrogen $N_2$ is fed into the load-lock chamber 6 through the gas inlet 7 to fill the load-lock chamber 6 with nitrogen $N_2$ gas.

Then, the gate $G_1$ is opened and while feeding a high purity gas mixture of nitrogen $N_2$ 99% and oxygen 1% from the gas inlet 5, the wafer boat 3 is removed from the diffusion furnace 1 at 700° C. to the load-lock chamber 6 filled with an atmosphere of nitrogen for 20 min (Removing step), from which the boat 3 is then removed.

Thus, a sequence of processing steps for thermal oxidation using the load-lock diffusion furnace 100 are completed.

A thermal oxidation film formed as described above was evaluated for its lifetime. Specifically, on a semiconductor wafer was formed a thermal oxidation film with a thickness such that a surface condition in a sample does not affect the film (about 800 Å), to prepare a sample. The sample is evaluated by a waveguide method (reflection method). Specifically, the sample was irradiated with IR light and a conductivity varying depending on excess carriers generated was measured as a variation in an amount of reflected microwave to determine a lifetime from a slope of variation in a reflection amount which was exponentially reduced.

Figure 3:
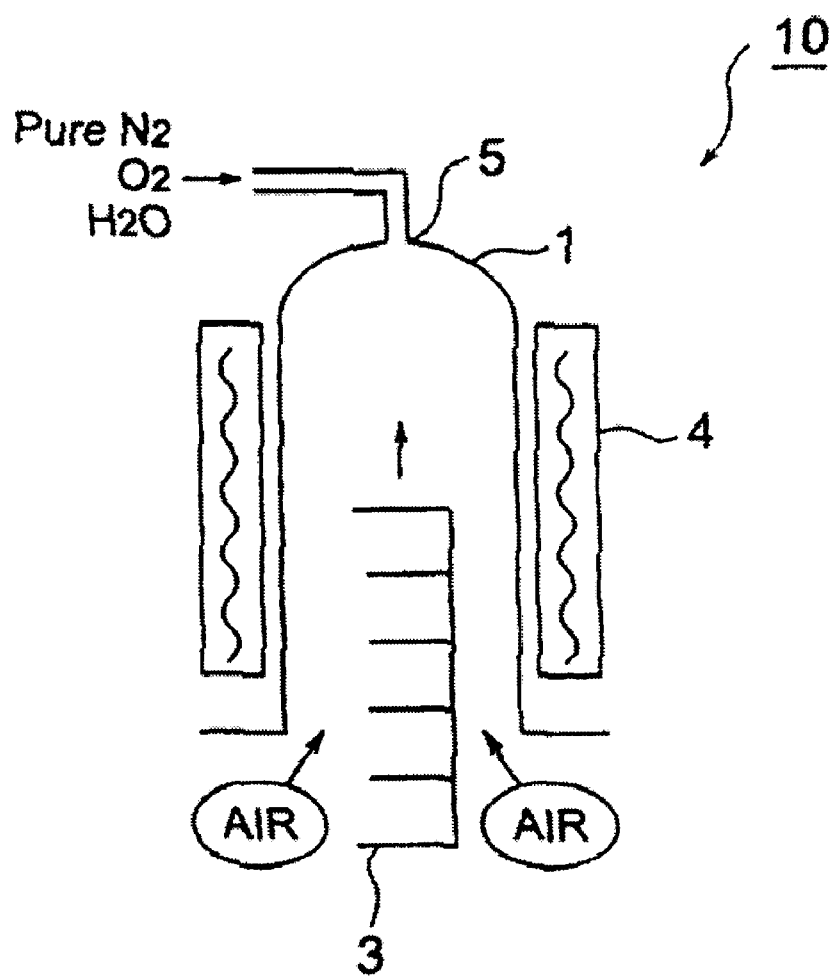
FIG. 3 schematically shows a configuration for an example of a conventional vertical diffusion furnace.

As a comparative example, a lifetime was determined by a waveguide method for a thermal oxide film formed using a conventional vertical diffusion furnace 10 without a load-lock shown in FIG. 3 and a thermal oxide film formed by conducting a cooling and a removing steps under a high purity 100% nitrogen $N_2$ in a load-lock diffusion furnace 100 shown in FIG. 1.

The thermal oxide film formed using the conventional vertical diffusion furnace 10 was formed as described below.

The wafer boat 3 is inserted for 15 min into the diffusion furnace 1 filled with a high purity atmosphere gas of nitrogen $N_2$ 99% and oxygen $O_2$ 1% at 850° C. (Inserting step).

Then, the semiconductor wafers are retained in the high purity atmosphere gas of nitrogen $N_2$ 99% and oxygen $O_2$ 1% at 850° C. for 15 min for stabilizing the internal temperature of the furnace to improve temperature homogeneity in and among the semiconductor wafers.

Under an atmosphere gas meeting the condition of hydrogen $H_2:O_2=1:2$ at 850° C., the wafers were subject to WET oxidation for, e.g., 3 min to provide an oxide film with a desired film thickness (oxidizing step).

Then, the atmosphere gas in the diffusion furnace 1 is replaced with nitrogen $N_2$. Under the high purity 100% nitrogen atmosphere, the wafers are annealed at 850° C. for 30 min (Annealing step).

Under a high purity atmosphere gas of nitrogen $N_2$ 100% at 850° C., the wafer boat 3 is removed for 15 min (Removing step).

The thermal oxide film formed conducting a cooling and a removing steps under a high purity atmosphere of nitrogen $N_2$ 100% in the load-lock diffusion furnace 100 shown in FIG. 1 was formed as described below.

An inserting, a heating, an oxidizing and an annealing steps were as described in the above embodiment.

In the cooling step, the diffusion furnace 1 was cooled from 850° C. to 700° C. for 40 min under a high purity atmosphere gas of nitrogen $N_2$ 100% (actually, 99.999% or higher).

Then, after evacuating the load-lock chamber 6 by turning on the pump DP, nitrogen $N_2$ was fed into the load-lock chamber 6 through the gas inlet 7. The wafer boat 3 was then removed from the diffusion furnace 1 under the atmosphere of nitrogen $N_2$ 100% at 700° C. to the load-lock chamber 6 filled with nitrogen $N_2$ for 20 min (Removing step).

The atmosphere gases, i.e., nitrogen $N_2$ and oxygen $O_2$, fed into the diffusion furnace 1 and the load-lock chamber 6 were of a high purity of 99.999% or higher in both the process for forming a thermal oxide film using the conventional vertical diffusion furnace 10 and the process conducting a cooling and a removing steps under a high purity atmosphere of nitrogen $N_2$ 100% in the load-lock diffusion furnace 100.

A lifetime was determined for the individual thermal oxide film formed as described above. The results were 150 to 300 $\mu$s for the thermal oxide film formed according to the process of this invention; 150 to 300 $\mu$s for that formed using the conventional vertical diffusion furnace 10 and 5 $\mu$s or less for that formed conducting a cooling and a removing steps under a high purity atmosphere of nitrogen $N_2$ 100%.

A thermal oxide film was formed and evaluated for its time dependent dielectric breakdown TDDB using a conventional vertical diffusion furnace 10 as described for a thermal oxide film formed according to the manufacturing process of this invention and determination of a lifetime. Specifically, samples with an MOS structure having a thermal oxide film with a thickness of 65 Å were prepared using each forming process. Then, a breakdown status (a flow of 1 mA current in a sample) was studied when a constant electric field (−12 MV/cm) was continuously applied to several tens of MOS capacitor TEG (area 65000 $\mu m^2$). Measurement was conducted for 1 hour.

Figure 2:
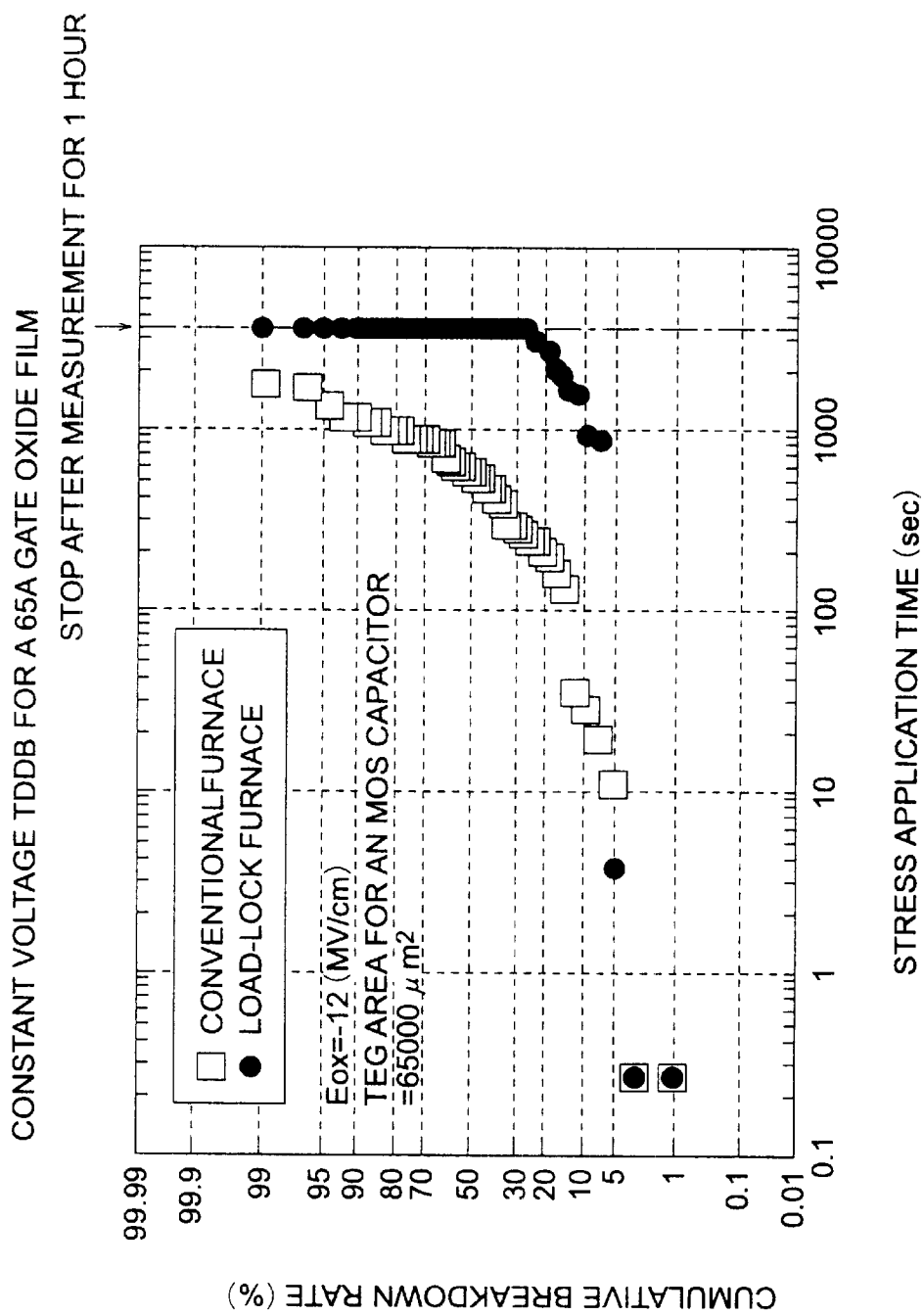
FIG. 2 shows a cumulative breakdown rate vs a stress application time, demonstrating the results of TDDB evaluation.

Consequently, the results shown in FIG. 2 were obtained. In FIG. 2, □ designates for a thermal oxide film by a process for forming a thermal oxide film using a conventional vertical diffusion furnace 10 while ● designates for a thermal oxide film by a process for forming a thermal oxide film according to this invention. As shown in FIG. 2, there were no differences for initial defects, but otherwise (for those practically released as a commercial product), it was confirmed that a film lifetime for an MOS capacitor TEG formed by the process for a thermal oxide film according to this invention was longer.

Thus, it was confirmed that a thermal oxide film excellent in a lifetime and TDDB evaluation could be provided as described above, i.e., conducting a cooling and a removing steps under a high purity atmosphere gas of nitrogen $N_2$ 99% and oxygen $O_2$ 1% using a load-lock diffusion furnace 100.

In particular, in the above embodiment using the load-lock diffusion furnace 100, the load-lock chamber 6 is evacuated and then high purity nitrogen $N_2$ is fed into the load-lock chamber 6 through the gas inlet 7. A cooling and a removing steps can be, therefore, conducted under a high purity atmosphere of nitrogen $N_2$ and oxygen $O_2$, which can prevent impurities in the air from being incorporated and thus can exclusively introduce a small amount of high purity $O_2$ in an interface between a thermal oxide film in a semiconductor wafer and a silicon substrate. A high quality thermal oxide film can be thus provided.

A lifetime was determined conducting only one of the cooling and the removing steps under the above mixed atmosphere gas of nitrogen $N_2$ 99% and oxygen $O_2$ 1%, while the other was conducted under an atmosphere gas of nitrogen $N_2$ 100%, and then a lifetime was determined. A lifetime determined was 100 to 150 $\mu$s. It has been found that when either the cooling or the removing step is conducted under the above mixed atmosphere gas, film quality is better than that when both cooling and removing are conducted under an atmosphere gas of nitrogen $N_2$ 100%, and that more better film quality can be achieved when both steps, rather than either the cooling or the removing step, are conducted under an atmosphere of nitrogen $N_2$ 99% and oxygen $O_2$ 1%.

The above embodiment have been described, where both cooling and removing steps are conducted under a high purity atmosphere gas of $N_2$ 99% and oxygen $O_2$ 1%, but oxygen $O_2$ may be contained at about 0.1 to 10%, preferably about 0.1 to 2%. In brief, any oxygen level may be acceptable as long as a broken ligand due to strain in an interface between a silicon substrate and a thermal oxide film is recoverable and it does not accelerate oxidation.

Similarly, oxygen $O_2$ used in an inserting, a heating and a stabilizing steps is introduced to prevent thermal etching on a silicon substrate surface (thermal-processing induced defects), and may not be limited to 1%. In brief, any level may be selected as long as thermal etching can be avoided and oxidation may not be accelerated.

The above embodiment has been described, where the oxidizing step is WET oxidation in an atmosphere gas meeting the relationship of $H_2:O_2 =1:2$. This invention is, however, not limited to it. Alternatively, the oxidation step may be accomplished by dry oxidation in an atmosphere gas of $O_2$ 100%.

The above embodiment has been described, where an active cooling step is conducted, but this invention is not limited to it. Similar effects may be achieved when cooling is not actively conducted, i.e., when a removing step is conducted without cooling, specifically in thermal oxidation at a relatively lower temperature, or when a removing step during which wafers are consequently cooled is conducted under a high purity atmosphere of nitrogen $N_2$ 99% and oxygen $O_2$ 1%.

INDUSTRIAL APPLICABILITY

As described above, according to this invention, an atmosphere gas for a semiconductor wafer is a mixture of nitrogen and oxygen at a level such that a thickness of an oxide film in the semiconductor wafer is not substantially varied, i.e., 0.1 to 10% of oxygen gas, when the semiconductor wafer is removed from a diffusion furnace, so that a thermal oxidation film excellent in a lifetime and TDDB evaluation can be provided.

In particular, when the semiconductor wafer is removed from the diffusion furnace after heating the semiconductor wafer and cooling the inside of the diffusion furnace to a predetermined temperature, an atmosphere during cooling the inside of the diffusion furnace is also a mixture of nitrogen and oxygen, so that a more improved thermal oxide film can be provided.

During the semiconductor wafer is in the diffusion furnace, the load-lock chamber is evacuated, nitrogen is fed into the load-lock chamber and then the semiconductor wafer is transferred to the load-lock chamber while feeding a gas mixture into the diffusion furnace, so that the semiconductor wafer can be easily transferred to the load-lock chamber under an atmosphere of high purity gas mixture while blocking impurities in the air.

An atmosphere gas around a semiconductor wafer is a gas mixture in a transferring step where the semiconductor wafer is transferred from a load-lock chamber to a diffusion furnace and a preliminary step before heating in the diffusion furnace, such as a warming step where the inside of the diffusion furnace is warmed to a predetermined temperature and a stabilizing step where the internal temperature of the diffusion furnace is stabilized, so that a higher quality thermal oxide film can be provided.

What is claimed is:

1. In a process for manufacturing a semiconductor device by heating a semiconductor wafer in a diffusion furnace equipped with a load-lock chamber to form an oxide film on said wafer, the improvement comprising using an atmosphere gas for said semiconductor wafer during removal of said wafer from said diffusion furnace, which atmosphere gas is a mixture of nitrogen gas and oxygen gas formed by blending the oxygen gas into the nitrogen gas in such an amount that the thickness of the oxide film on said semiconductor wafer remains substantially constant.

2. The process for manufacturing a semiconductor device according to claim 1, wherein after said heating, said diffusion furnace is cooled prior to removing said semiconductor wafer from said diffusion furnace, and during the cooling, the atmosphere gas in said diffusion furnace is said gas mixture.

3. The process for manufacturing a semiconductor device according to claim 1 or 2, wherein while said semiconductor wafer is in said diffusion furnace, nitrogen gas is fed to said load-lock chamber after said load-lock chamber is evacuated, and then said semiconductor wafer is transferred to said load-lock chamber while feeding said gas mixture to said load-lock chamber.

4. The process for manufacturing a semiconductor device according to claim 1, further comprising the steps of placing the semiconductor wafer in the load-lock chamber and then transferring the semiconductor wafer from said load-lock chamber to said diffusion furnace, wherein an atmosphere gas for said semiconductor wafer during the transferring step and before initiating said heating is said gas mixture.

5. The process for manufacturing a semiconductor device according to claims 1, wherein said gas mixture contains 0.1 to 10% of oxygen gas.

6. The process for manufacturing a semiconductor device according to claim 4, including preliminary steps are the steps of warming said diffusion furnace and stabilizing the temperature of the diffusion furnace after warming and before initiating the heating of the semiconductor wafer in the furnace.

* * * * *